United States Patent
Hanna

(10) Patent No.: US 11,716,096 B2
(45) Date of Patent: *Aug. 1, 2023

(54) MEMORY ERROR CORRECTION BASED ON LAYERED ERROR DETECTION

(71) Applicant: Micron Technology, Inc., Boise, ID (US)

(72) Inventor: Stephen D. Hanna, Fort Collins, CO (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/735,786

(22) Filed: May 3, 2022

(65) Prior Publication Data

US 2022/0337271 A1 Oct. 20, 2022

Related U.S. Application Data

(63) Continuation of application No. 17/117,913, filed on Dec. 10, 2020, now Pat. No. 11,329,673.

(51) Int. Cl.
*H03M 13/29* (2006.01)
*G06F 11/10* (2006.01)

(52) U.S. Cl.
CPC ..... *H03M 13/2906* (2013.01); *G06F 11/1004* (2013.01); *G06F 11/1068* (2013.01)

(58) Field of Classification Search
None
See application file for complete search history.

(56) References Cited

U.S. PATENT DOCUMENTS

| | | | | |
|---|---|---|---|---|
| 5,357,527 | A * | 10/1994 | Coates | G06F 11/10 714/755 |
| 7,587,658 | B1 * | 9/2009 | Tong | G06F 11/1012 714/763 |
| 8,930,799 | B1 * | 1/2015 | Langner | H03M 13/6325 714/758 |
| 2004/0088636 | A1 * | 5/2004 | Cypher | G06F 13/1668 714/E11.049 |

(Continued)

OTHER PUBLICATIONS

B. Godard, J. -M. Daga, L. Torres and G. Sassatelli, "Architecture for Highly Reliable Embedded Flash Memories," 2007 IEEE Design and Diagnostics of Electronic Circuits and Systems, Krakow, Poland, 2007, pp. 1-6, doi: 10.1109/DDECS.2007.4295257. (Year: 2007).*

(Continued)

*Primary Examiner* — Daniel F. McMahon
(74) *Attorney, Agent, or Firm* — Holland & Hart LLP

(57) ABSTRACT

Methods, systems, and devices for memory error correction based on layered error detection are described. In some examples, a memory system identifies, based on a first type of error detection procedure, that a set of bits includes a quantity of erroneous bits that is uncorrectable based on the first type of error detection procedure alone. The memory system generates one or more candidate sets of bits based on altering different groups of bits within the set of bits and evaluate one or more such candidate sets of bits using a second type of error detection procedure until a candidate set of bits is identified as error-free. The memory system then corrects the set of bits based on the candidate set of bits identified as error-free.

20 Claims, 6 Drawing Sheets

(56) References Cited

U.S. PATENT DOCUMENTS

| | | | | |
|---|---|---|---|---|
| 2012/0005560 A1* | 1/2012 | Steiner | ............. | H03M 13/2918 |
| | | | | 714/780 |
| 2014/0173381 A1* | 6/2014 | Lee | ................... | H03M 13/4115 |
| | | | | 714/769 |
| 2020/0067637 A1* | 2/2020 | Wang | ................ | H03M 13/6306 |
| 2021/0049068 A1* | 2/2021 | Schaefer | ............. | G06F 11/1076 |
| 2021/0255918 A1* | 8/2021 | Jovanovic | ........... | G06F 11/1004 |

OTHER PUBLICATIONS

Gottscho et al, "Software-Defined ECC: Heuristic Recovery from Uncorrectable Memory Errors," published on Oct. 24, 2017 (15 pages).

M. Ebrahimi and M. B Tahoori, "Stepped parity: A low-cost multiple bit upset detection technique," 2015 IEEE International Test Conference (ITC), 2015, pp. 1-8, doi: 10.1109/TEST.2015. 7342410. (Year: 2015).

M. S. Sadi, M. S. Rahman and K. M. Imrul Kayes Sikdar, "Error detection & correction using horizontal-vertical-diagonal-shift method," 2014 International Conference on Electrical Engineering and Information & Communication Technology, 2014, pp. 1-7, doi: 10.1109/ICEEICT.2014.6919061. (Year: 2014).

\* cited by examiner

MEMORY ERROR CORRECTION BASED ON LAYERED ERROR DETECTION

CROSS REFERENCE

The present application for patent is a continuation of U.S. patent application Ser. No. 17/117,913 by Hanna et al., entitled "MEMORY ERROR CORRECTION BASED ON LAYERED ERROR DETECTION," filed Dec. 10, 2020, assigned to the assignee hereof, and expressly incorporated by reference herein.

FIELD OF TECHNOLOGY

The following relates generally to one or more systems for memory and more specifically to memory error correction based on layered error detection.

BACKGROUND

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
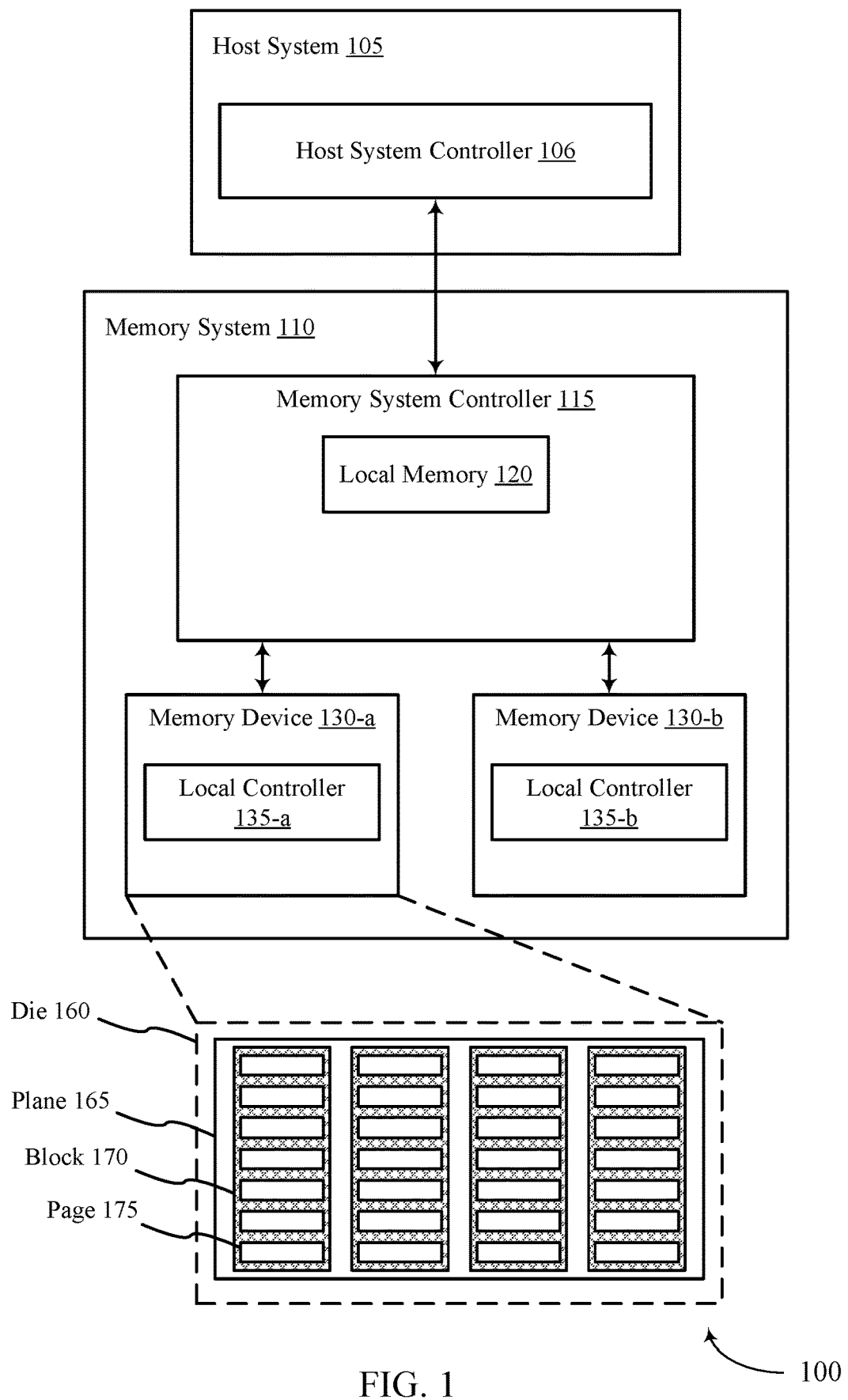
FIG. 1 illustrates an example of a system that supports memory error correction based on layered error detection in accordance with examples as disclosed herein.

A controller for a memory device may perform an error detection procedure on a set of bits (e.g., data) before sending the bits to a host system. In some cases, however, the controller may detect an error that the controller may be unable to correct based on the error detection procedure alone. For example, the controller may perform a single error correcting and dual error detecting (SECDED) procedure on the set of bits before sending the bits to a host system, and the SECDED procedure may allow the controller to detect that at least two bits of the set of bits are incorrect, but the SECDED procedure may not support correcting those two bits.

In some cases, in response to detecting an uncorrectable error, the controller may initiate a reset procedure for the memory device, abort a command from the host system associated with retrieving the set of bits, or both. Performing the reset procedure may involve undesirable latencies, and aborting the command may be undesirable from a reliability perspective, among other drawbacks that may be appreciated by one of ordinary skill in the art.

As described herein, however, in response to detecting an error using a first type of error detection procedure, the controller may correct the erroneous bits based on performing a second type of error detection procedure (e.g., a cyclic redundancy check (CRC) procedure), possibly on a broader set of bits that includes the set of bits in which the error was detected along with one or more additional bits. For instance, after retrieving a set of bits from a memory array, the controller may perform the first type of error detection procedure (e.g., a SECDED procedure) on the set of bits using a first type of error detection code (e.g., a SECDED code) and detect an otherwise uncorrectable error (e.g., a double-bit error). A second type of error detection code (e.g., a CRC code) applicable to the set of bits may be stored in the memory array. For example, the set of bits may in some cases be part of a broader set of bits for which the corresponding second type of error detection code is stored in the memory array (e.g., the memory array may store a CRC code for a superset of bits, of which the set of bits with the detected error is a subset). The controller may generate one or more candidate sets of bits, each of which may correspond to the set of bits but with a different group of N bits altered, where N is equal to the quantity of incorrect bits detected using perform the first type of error detection procedure (e.g., N may be two (2) where the first type of error detection procedure is a SECDED procedure). The controller may then evaluate one or more such candidate sets of bits using a second type of error detection procedure based on the second type of error detection code (e.g., may perform a CRC check on one or more candidate sets of bits) until a candidate set of bits is identified as error-free. Where the second type of error detection procedure is performed on a superset of bits of which the corrupted set of bits is a subset, each candidate set of bits may include any additional bits within the superset of bits, along with an altered version of the corrupted set of bits.

Bits within the candidate set of bits that is identified as error-free may be used to replace the erroneous bits associated with the error detected using the first type of error detection procedure. In some cases, the controller may then transmit the updated (e.g., corrected) set of bits to the host system. These and other aspects of the teachings herein thus may avoid latencies associated with a reset procedure, extend an error correcting capability and reliability of a memory system, or both, among other advantages that may be appreciated by one of ordinary skill in the art.

Features of the disclosure are initially described in the context of systems as described with reference to FIGS. 1 through 2. Features of the disclosure are further described in the context of a process flow as described with reference to FIG. 3. These and other features of the disclosure are further illustrated by and described with reference to an apparatus diagram and flowcharts that relate to memory error correction based on layered error detection as described with reference to FIGS. 4-6.

FIG. 1 illustrates an example of a system 100 that supports memory error correction based on layered error detection in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random-access memory (SRAM) or other memory that may be used by the memory system controller 115 for internal storage or calculations, for example, related to the functions ascribed herein to the memory system controller 115.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto-RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, performing concurrent operations in different planes 165 may be subject to one or more restrictions, such as identical operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

The system 100 may include any quantity of non-transitory computer readable media that support memory error correction based on layered error detection. For example, the host system 105, the memory system controller 115, or a memory device 130 may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system controller 115 coupled with a memory device 130 and a host system 105 may receive a set of bits (e.g., data) from the memory device 130 to transmit to the host system 105 (e.g., in response to a read command received by the memory system controller 115 from the host system 105 for the set of bits, where the set of bits are stored by the memory device 130). In some examples, the memory system controller 115 may identify, based on a first type of error detection procedure (e.g., a SECDED procedure), that the set of bits includes a quantity of bit errors (erroneous bits) that is uncorrectable using the first type of error detection procedure (e.g., that at least two bits of the set of bits are incorrect, where the first type of error detection procedure is a SECDED procedure). For example, errors may arise in connection with receive the set of bits at the memory system controller 115 from the memory device 130 (e.g., transmission errors), storing the set of bits at the local memory 120 (e.g., storage errors), or any combination thereof. The set of bits may be checked for errors using the first type of error detection procedure after reading the set of bits from the local memory 120 for transmission to the host system 105.

To avoid performing a reset of the memory system 110, avoid aborting a related command from the host system 105, or both based on a detected error that is not otherwise correctable using the first type of error detection procedure, the memory system controller 115 may update (e.g., correct) the at least two bits of the set of bits based on a second type of error detection procedure (e.g., a CRC procedure). For instance, the memory system controller 115 may generate one or more candidate sets of bits, where each of the one or more candidate sets of bits is generated based on altering a respective group of N bits within the set of bits having the detected error, where N is the corresponding quantity of bit errors. Additionally, the memory system controller 115 may evaluate each of the one or more candidate sets of bits using the second type of error detection procedure (e.g., repeated instances thereof) until a candidate set of bits is identified as error-free. In some such examples, the first type of error detection procedure may be based on a first type of error detection code (e.g., a SECDED code), and the second type of error detection procedure may be based on a second type of error detection code (e.g., a CRC code), where the second type of error detection code may be stored with the memory device 130. Additionally or alternatively, the second type of error detection code may correspond to (e.g., have been previously generated based on) a superset of bits that includes the set of bits in which the error is detected using the first type of error detection procedure, in which case each candidate set of bits may include any additional bits of the superset, along with the altered version of the set of bits in which the error is detected using the first type of error detection procedure. In some cases, the memory system controller 115 may transmit the corrected set of to the host system 105.

Though certain examples may be described herein in the context of NAND memory devices, it is to be understood that the teachings herein may be applied in the context of any type of memory.

Figure 2:
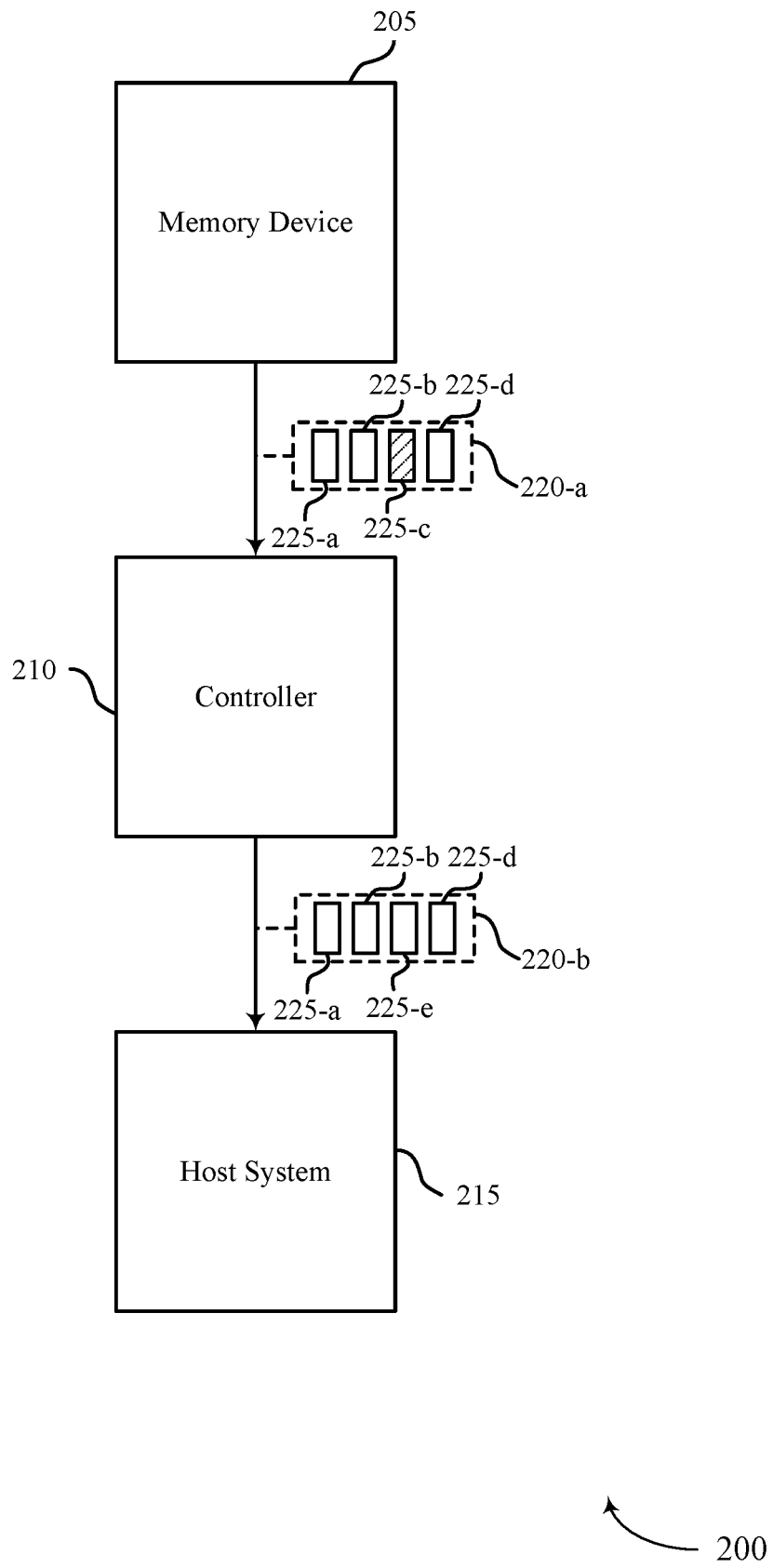
FIG. 2 illustrates an example of a system that supports memory error correction based on layered error detection in accordance with examples as disclosed herein.

FIG. 2 illustrates an example of a system 200 that supports memory error correction based on layered error detection in accordance with examples as disclosed herein. System 200 may include a memory device 205, a controller 210, and a host system 215. In some examples, system 200 may include one or more aspects of FIG. 1. For instance, memory device 205 may be an example of a memory device 130 as described with reference to FIG. 1, controller 210 may be an example of a memory system controller 115 or a local controller 135 as described with reference to FIG. 1, and host system 215 may be an example of a host system 105 as described with reference to FIG. 1.

In some examples, memory device 205 may be an example of a NAND memory device (e.g., a memory device that includes one or more NAND memory arrays configured to store data from and retrieve data for controller 210). Controller 210 may include local memory, such as local SRAM memory (e.g., controller 210 may include a set of SRAM memory cells configured to store data from memory device 205, which may be an example of a local memory 120 as described with reference to FIG. 1). Controller 210 may store (e.g., cache, queue) data received from memory device 205 or host system 215 within the local memory for some amount of time before relaying the data to host system 215 or memory device 205 (e.g., in response to commands received from the host system 215).

Memory device 205 may be coupled with controller 210 (e.g., via one or more respective first busses or other signal paths) and controller 210 may be coupled with host system 215 (e.g., via one or more respective second busses or other signal paths). Memory device 205 may be configured to provide data (e.g., one or more bits) to controller 210 and controller 210 may be configured to provide the data to host system 215 (e.g., in response to a read command from the host system 215). Additionally or alternatively, controller 210 may be configured to receive data (e.g. one or more bits) from host system 215 and provide the data to memory device 205, where memory device 205 may be configured to store the data (e.g., in response to a write command from the host system 215).

In some examples, controller 210 may receive a set of bits 220-a from a memory array of memory device 205 (e.g., based on a read command received by controller 210 from host system 215, which controller 210 may direct to memory device 205). The set of bits 220-a may include any quantity of subsets of bits 225. For example, the set of bits 220-a may include subsets of bits 225-a, 225-b, 225-c, and 225-d. In some examples, one or more bits within a subset of bits 225 may flip incorrectly between retrieval from a memory array at memory device 205 and later retrieval from local memory cells of controller 210 (e.g., from SRAM memory cells). In the example of FIG. 2, one or more bits within subset of bits 225-c may be erroneous. For instance, one or more transmission errors may occur based on the subset of bits 225-c being transmitted from memory device 205 to controller 210. Additionally or alternatively, one or more components at controller 210 may distort the signal associated with subset of bits 225-c such that controller 210 determines that one or more bits of subset of bits 225-c have a flipped value relative to the actual value of the bits. Additionally or alternatively, an error may occur while the subset of bits 225 is stored within the local memory of controller 210 (e.g., due to electromagnetic disturbance or some other phenomenon).

Regardless of the cause, controller 210 may identify, using a first type of error detection procedure, that at least two bits in a subset of bits 225 are incorrect but may be unable to correct the detected error using the same first type of error detection procedure. The first type of error detection procedure may be based on a first type of error detection code. For instance, controller 210 may identify that at least two bits in subset of bits 225-c are incorrect using a SECDED procedure, which may be based on a SECDED code. In some examples, controller 210 may evaluate a subset of bits 225 using the first type of error detection procedure after having stored the set of bits within local memory cells of the controller 210 (e.g., SRAM memory cells), such as after reading the set of bits from such local memory cells in preparation for transmitting the set of bits to host system 215.

In some cases, each subset of bits 225 may be associated with a respective error detection code of the first type (e.g., a respective SECDED code). For instance, subset of bits 225-*a* may be associated with a first error detection code of the first type, subset of bits 225-*b* may be associated with a second error detection code of the first type, subset of bits 225-*c* may be associated with a third error detection code of the first type, and subset of bits 225-*d* may be associated with a fourth error detection code of the first type.

To correct bit errors that are detected using the first type of error detection procedure but uncorrectable using the first type of error detection procedure alone, controller 210 may use a second type of error detection procedure. For instance, controller 210 may receive from memory device 205 one or more parity bits associated with a corrupted subset of bits 225 and perform a second type of error detection procedure based on the parity bits. The parity bits may comprise a second type of error detection code (e.g., a CRC code).

The second type of error detection code may be associated with (e.g., may have been previously generated based on and stored by memory device 205 in association with) the set of bits 220-*a* that includes the corrupted subset of bits 225-*c*. As shown in the example of FIG. 2, the set of bits 220-*a* may also include any quantity of additional subsets of bits 225. Thus, in some cases, the first type of error detection procedure may operate at the subset level of granularity (e.g., each subset of bits 225 may be associated with and separately evaluated using a first type of error detection procedure based on a corresponding first type of error detection code), while the second type of error detection procedure may operate at a broader set level of granularity (e.g., each set of bits 220 may be associated with and evaluated using a second type of error detection procedure based on a corresponding second type of error detection code). Accordingly, error detection procedures and codes of the second type may be associated with supersets of bits relative to the bits associated with error detection procedures and codes of the first type, with a set of bits 220 being a superset that includes multiple subsets of bits 225.

To update subset of bits 225-*c*, controller 210 may generate one or more candidate sets of bits 220, where each of the one or more candidate sets of bits 220 are based on altering a respective group of N bits within the set of bits 220-*a*, and more particularly a respective group of N bits within the subset of bits 225-*c* corresponding to the error detected using the first type of error detection procedure. N may be equal to the quantity of incorrect bits associated with the detected error (e.g., N may be two (2) where the first type of error detection procedure is a SECDED procedure).

For instance, if each subset of bits 225-*c* has x bits, and N is equal to two (2), controller 210 may generate up to $$\frac{x!}{2!(x-2)!}$$

candidate sets of bits 220, where each of the candidate sets of bits 220 is different from the other candidate sets of bits. That is, relative to the set of bits 220 that includes the subset of bits 225-*c* with the detected error, a different set of two bits within the corrupted subset of bits 225-*c* may be altered (flipped) in order to generate each candidate set of bits 220. A candidate set of bits 220 may be evaluated using the second type of error detection procedure (e.g., using the CRC code associated with the set of bits 220-*a*) to determine whether the candidate set of bits is error-free, in which case the altered two bits were the erroneous bits that gave rise to the error previously detected in the corrupted subset of bits 225-*c*. Thus, controller 210 may generate and evaluate one or more candidate sets of bits 220 using the second type of error detection procedure (e.g., using a CRC code) until a candidate set of bits is identified as error-free.

In some cases, controller 210 may transmit an updated set of bits 220-*b*, or any portion thereof, to host system 215, where the updated set of bits 220-*b* or portion thereof may correspond to (e.g., be identical to) the candidate set of bits 220 that was identified as error-free using the second type of error detection procedure, or a portion thereof. For example, the updated set of bits 220-*b* may include the subset of bits 225-*a*, 225-*b*, and 225-d that were included in set of bits 220-*a*. Additionally, the updated set of bits 220-*b* may include subset of bits 225-*e*, which may be an updated version of subset of bits 225-*c* in which N bits have been updated to correct values. In some examples, after updating the subset of bits 225-*c* and before transmitting the updated set of bits 220-*b*, the controller 210 may verify that each bit of the updated subset of bits 225-*e* or updated set of bits 220-*b* is correct using one or more instances of the first type of error detection procedure (e.g., controller 210 may perform another SECDED evaluation on the updated subset of bits 225-*e* or any other subset of bits 225 within the updated set of bits 220-*b* to verify the correction of the alteration determined using the CRC procedure). In such examples, transmitting the updated set of bits 220-*b* or portion thereof to host system 215 may be based on (e.g., contingent on, responsive to) verifying that each bit of the updated set of bits or portion thereof is correct.

Figure 3:
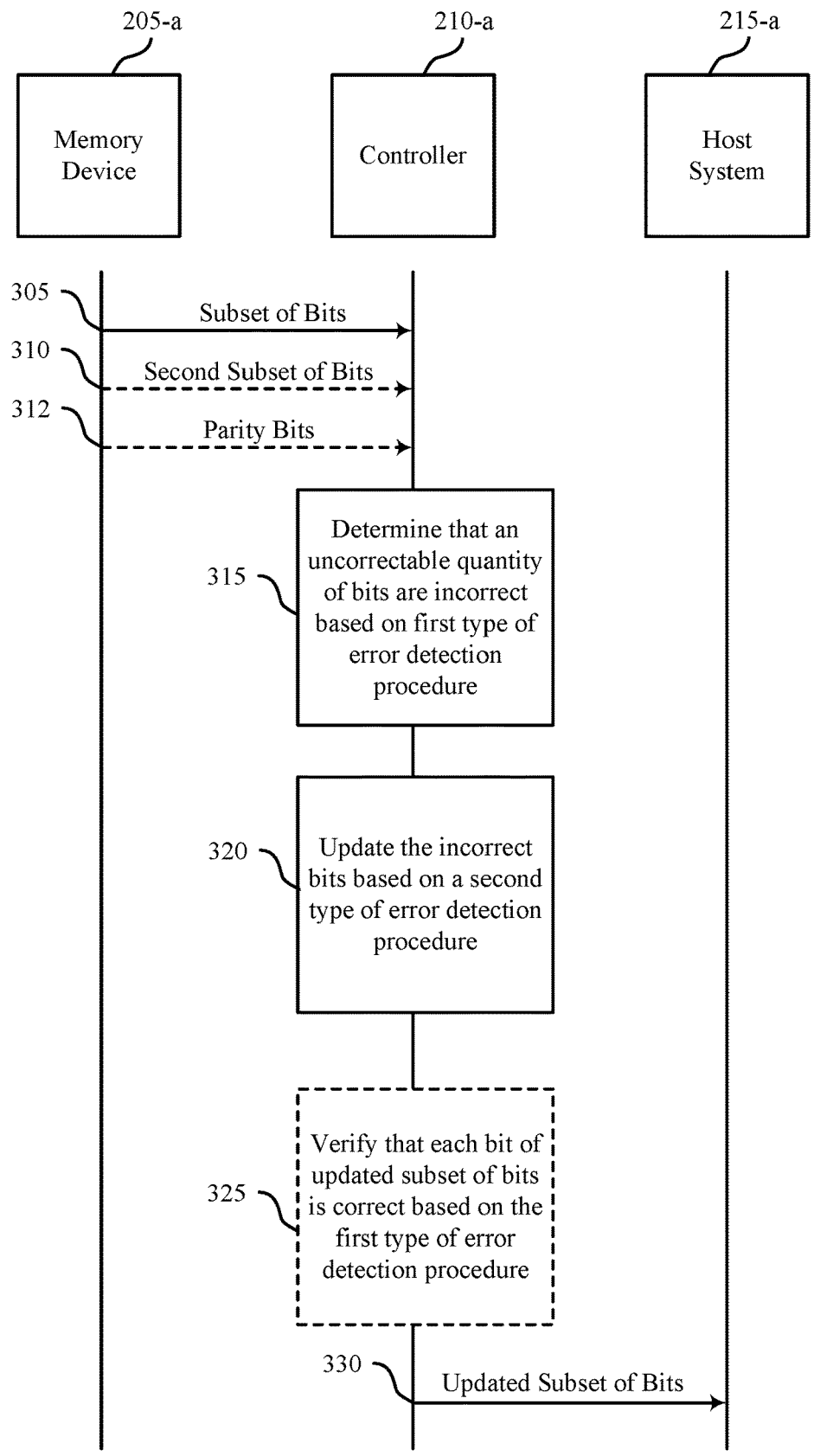
FIG. 3 illustrates an example of a process flow that supports memory error correction based on layered error detection in accordance with examples as disclosed herein.

FIG. 3 illustrates an example of a process flow 300 that supports memory error correction based on layered error detection in accordance with examples as disclosed herein. In some examples, process flow 300 may be implemented by one or more aspects of FIGS. 1 and/or 2. For instance, memory device 205-*a* may be an example of aspects of a memory device 205 as described with reference to FIG. 2 or a memory device 130 as described with reference to FIG. 1, controller 210-*a* may be an example of aspects of a controller 210 as described with reference to FIG. 2 or one or more of memory system controller 115 or local controller 135 as described with reference to FIG. 1, and host system 215 may be an example of a host system 215 as described with reference to FIG. 2 or a host system 105 as described with reference to FIG. 1. Aspects of the process flow 300 may be implemented by a controller (e.g., a controller 210-*a*), among other components. Additionally or alternatively, aspects of the process flow 300 may be implemented as instructions stored in memory (e.g., firmware stored in a memory coupled with a memory system 110). For example, the instructions, in examples where the instructions are executed by a controller (e.g., the memory system controller 115 of FIG. 1), may cause the controller to cause a device to perform the operations of the process flow 300.

In some examples, memory device 205-*a* may be an example of a NAND memory device (e.g., a memory device that includes one or more NAND memory arrays configured to store data from and retrieve data for controller 210-*a*) and controller 210-*a* may be a controller for the memory device 205-*a* that includes local memory (e.g., a controller 210-*a* that includes SRAM memory cells configured to store data from memory device 205-*a* before sending such data to host system 215-*a*).

In some examples, before executing process flow 300, controller 210-a may receive a write command from host system 215-a along with an associated set of bits. In some examples, controller 210-a may send the set of bits to memory device 205-a, and memory device 205-a may store the set of bits within a memory array (e.g., a NAND memory array). In some examples, memory device 205-a may also store a second type of error detection code (e.g., a CRC code) for the set of bits (e.g., within a same page of the memory array or as metadata for the set of bits). For example, memory device 205-a may generate the second type of error detection code after receiving the set of bits from controller 210-a, or controller 210-a may generate the second type of error detection code and send it to the memory device 205-a.

While the set of bits and associated second type of error detection code are stored by memory device 205-a, controller 210-a may receive a read command from host system 215-a for the set of bits. In response to the read command, controller 210-a may request the set of bits from memory device 205-a, and memory device 205-a may retrieve the set of bits and may transmit the set of bits to controller 210-a.

In some cases, memory device 205-a may transmit the set of bits to controller 210-a as one or more subsets. For instance, as shown in the example of FIG. 3, memory device 205-a may transmit a first subset of the set of bits to controller 210-a at 305, and memory device 205-a may transmit a second subset of the set of bits to controller 210-a at 310. It is to be understood that a set of bits as described herein may include any quantities of subsets of bits as described herein, and thus any quantity of subsets of bits may be transmitted by memory device 205-a to controller 210-a, though two subsets are illustrated in the example of FIG. 3. Further, it is to be understood that a set of bits may be operated upon by controller 210-a as comprising different subsets for error detection purposes regardless of whether the set of bits is transmitted by memory device 205-a as like subsets.

At 312, memory device 205-a may transmit one or more parity bits associated with a second type of error detection procedure (e.g., a CRC code for a CRC procedure) to controller 210-a. For example, memory device 205-a may transmit the second type of error detection code that was previously stored by memory device 205-a in association with the set of bits. Though shown in the example of FIG. 3 as transmitted before 315, memory device 205-a may transmit the one or more parity bits at some other time, such as after 315 (e.g., in response to a request from controller 210-a, which may be based on controller 210-a detecting an error at 315).

At 315, it may be determined that a quantity of bits N within the first subset of bits are incorrect based on a first type of error detection procedure, but the erroneous bits may be uncorrectable using the first type of error detection procedure alone (e.g., a two-bit error may be detected using a SECDED procedure). As noted elsewhere, bits of the first subset of bits may have become corrupted (e.g., may be decoded as having erroneous values) due to one or more transmission errors associated with exchanging the set of bits between memory device 205-a and controller 210-a, one or more storage errors associated with storing the data at memory device 205-a or controller 210-a for some duration of time, or any combination thereof.

At 320, the N bits may be updated based on a second type of error detection procedure. For instance, controller 210-a may update the N bits. In some examples, controller 210-a updating the N may include controller 210-a generating one or more candidate sets of bits, where each of the one or more candidate sets of bits is generated based on altering a respective group of N within the first set of bits. Each of the candidate sets of bits may also include the second subset of bits, or any other bits within the set of bits corresponding to the parity bits received at 312.

Additionally, controller 210-a updating the N bits may include controller 210-a evaluating one or more of candidate sets of bits using the second type of error detection procedure (e.g., using the second type of error detection code received from memory device 205-a) until a candidate set of bits is identified as error-free, the updating (e.g., correcting) the first subset of bits to include corresponding bits of the candidate set of bits identified as error-free.

In some examples, the first type of error detection procedure may be based on a first type of error detection code and the second type of error detection procedure may be based on a second type of error detection code different than the first type of error detection code. The first subset of bits may be associated with a first error detection code of the first type and the second subset of bits may be associated with a second error detection code of the first type. Additionally or alternatively, the set of bits and the second set of bits may each be associated with a same error detection code of the second type.

At 325, after updating the N bits, on the first type of error detection procedure may be used to verify that each bit of the updated first subset of bits is correct. For instance, controller 210-a may verify that each bit of the updated first subset of bits is correct. In some examples, controller 210-a may perform the first type of error detection procedure (e.g., a SECDED procedure) on each subset of the updated set of bits, or at least on the subset in which the error was previously identified at 315.

At 330, the updated first subset of bits or an updated set of bits that includes the updated first subset may be transmitted. For instance, controller 210-a may transmit the updated first subset of bits or an updated set of bits that includes the updated first subset to host system 215-a. In some examples, controller 210-a may transmit the updated first subset of bits in response to (e.g., contingent on) verifying at 325 that each bit of the updated first subset of bits is correct after updating the N bits.

Techniques as described herein may be associated with one or more advantages. For instance, by performing the second type of error detection procedure after the first type of error detection procedure, the controller 210-a may be able to correct errors impacting a greater quantity of bits than would otherwise be correctable using the first type of error detection procedure alone. For example, controller 210-a may be able to correct up to double-bit errors while using a SECDED scheme by supplementing the SECDED scheme with a CRC-based error detection scheme as described herein. Thus, by using a layered error detection scheme as described herein, an error correcting ability and hence a reliability of a system may be increased (e.g., a failure in time (FIT) rate may be decreased), relative to using either error detection scheme alone. Additionally, latencies associated with various reset procedures may also be avoided, among other possible benefits.

Figure 4:
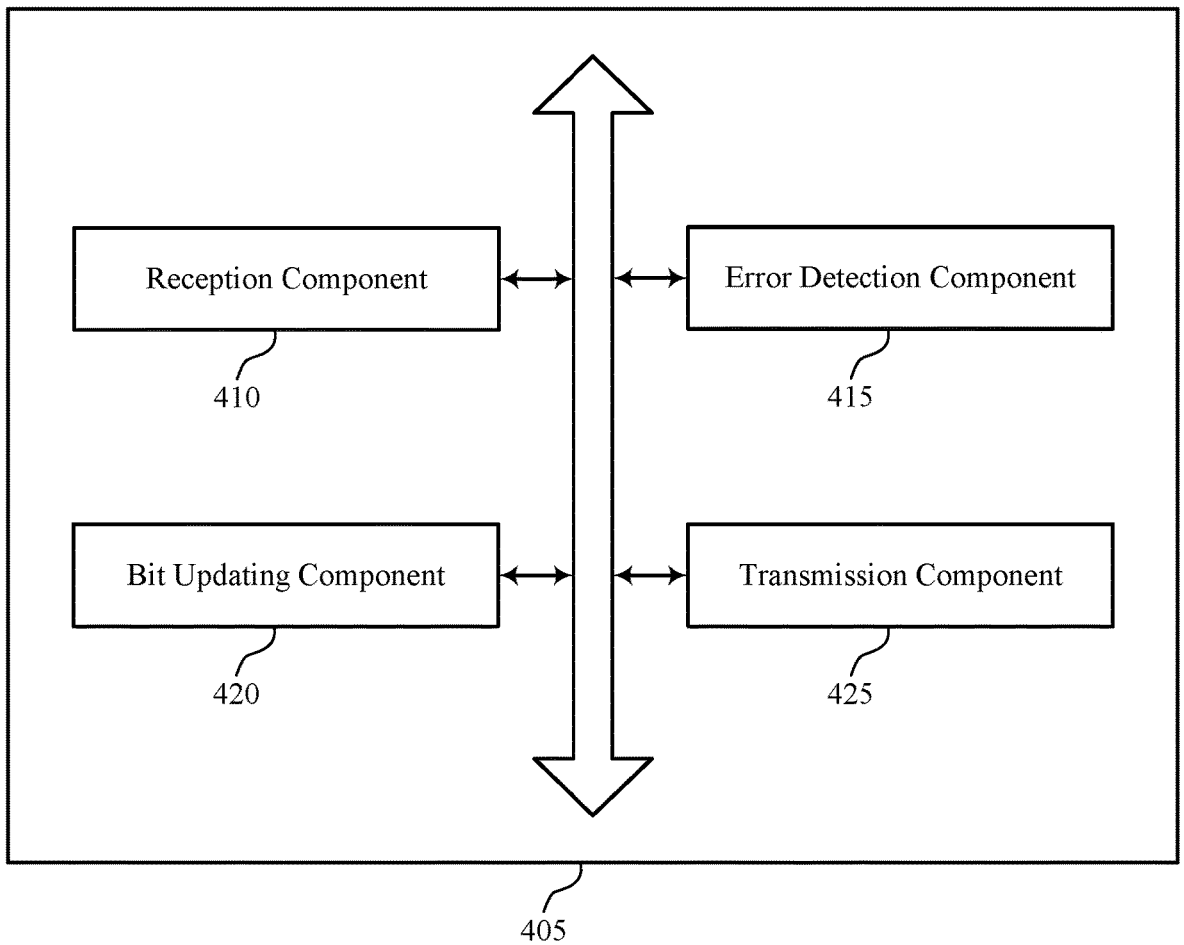
FIG. 4 shows a block diagram of a memory system that supports memory error correction based on layered error detection in accordance with examples as disclosed herein.

FIG. 4 shows a block diagram 400 of a memory system 405 that supports memory error correction based on layered error detection in accordance with examples as disclosed herein. The memory system 405 may be an example of aspects of a memory system as described with reference to FIGS. 1 through 3. The memory system 405, or various components thereof, may be an example of means for performing various aspects of memory error correction based on layered error detection as described herein. For example, the memory system 405 may include a reception component 410, an error detection component 415, a bit updating component 420, a transmission component 425, or any combination thereof. Each of these components may communicate, directly or indirectly, with one another (e.g., via one or more buses).

The reception component 410 may be configured as or otherwise support a means for receiving a set of bits from a memory array. The error detection component 415 may be configured as or otherwise support a means for identifying, based at least in part on a first type of error detection procedure that is operable to detect at least two bit errors (e.g. operable to detect—e.g., capable of detecting—up to some quantity of bit errors, where the quantity is greater than or equal to two) associated with the set of bits, that at least two bits of the set of bits are incorrect. The bit updating component 420 may be configured as or otherwise support a means for updating the at least two bits of the set of bits based at least in part on a second type of error detection procedure. The transmission component 425 may be configured as or otherwise support a means for transmitting the updated set of bits to a host device.

In some examples, the first type of error detection procedure may be based at least in part on a first type of error detection code. In some examples, the second type of error detection procedure may be based at least in part on a second type of error detection code different than the first type. In some examples, the reception component 410 may be configured as or otherwise support a means for receiving a second set of bits, where the set of bits is associated with a first error detection code of the first type, the second set of bits is associated with a second error detection code of the first type, and the set of bits and the second set of bits are each associated with a same error detection code of the second type.

In some examples, to support updating the at least two bits of the set of bits, the bit updating component 420 may be configured as or otherwise support a means for generating one or more candidate sets of bits, each of the one or more candidate sets of bits based at least in part on altering a respective two bits within the set of bits. In some examples, to support updating the at least two bits of the set of bits, the bit updating component 420 may further be configured as or otherwise support a means for evaluating each of the one or more candidate sets of bits using the second type of error detection procedure until a candidate set of bits is identified as error-free, where the updated set of bits includes the candidate set of bits that is identified as error-free.

In some examples, the error detection component 415 may be configured as or otherwise support a means for verifying, after updating the at least two bits and based at least in part on the first type of error detection procedure, that each bit of the updated set of bits is correct, where transmitting the updated set of bits to the host device is based at least in part on verifying that each bit of the updated set of bits is correct.

In some examples, the reception component 410 may be configured as or otherwise support a means for receiving one or more parity bits associated with the second type of error detection procedure from the memory array, where updating the at least two bits is based at least in part on the one or more parity bits.

In some examples, the first type of error detection procedure may be based at least in part on a SECDED code. In some examples, the second type of error detection procedure may be based at least in part on an CRC code.

In some examples, the memory array may be a NAND memory array configured to store the set of bits.

In some examples, the set of bits may be received at SRAM memory cells, where identifying that the at least two bits of the set of bits are incorrect and updating the at least two bits of the set of bits occur after the set of bits are received at the SRAM memory cells.

Figure 5:
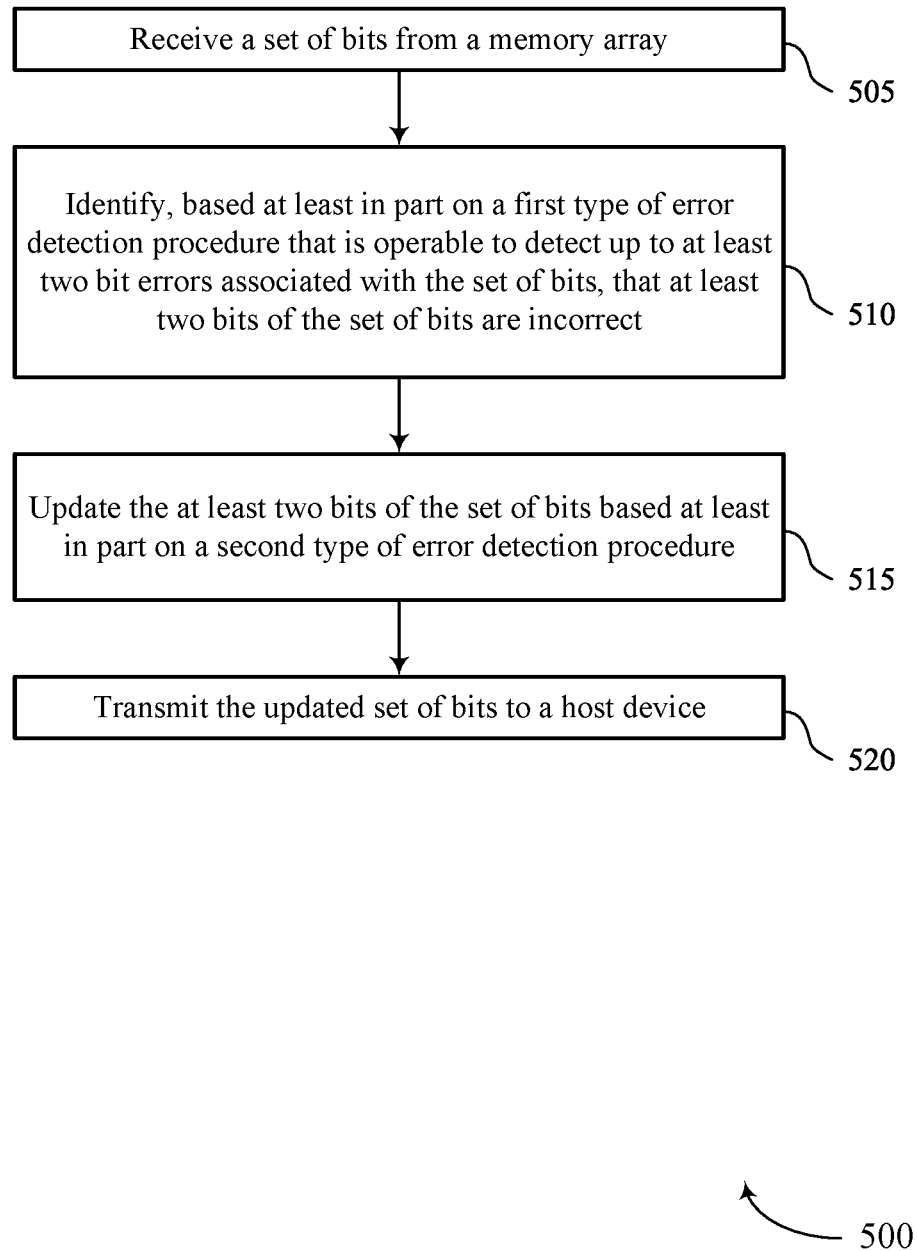
FIGS. 5 and 6 show flowcharts illustrating a method or methods that support memory error correction based on layered error detection in accordance with examples as disclosed herein.

FIG. 5 shows a flowchart illustrating a method 500 that supports memory error correction based on layered error detection in accordance with examples as disclosed herein. The operations of method 500 may be implemented by a memory system or its components as described herein. For example, the operations of method 500 may be performed by a memory system as described with reference to FIGS. 1 through 4. In some examples, a memory system may execute a set of instructions to control the functional elements of the device to perform the described functions. Additionally or alternatively, the memory system may perform aspects of the described functions using special-purpose hardware.

At 505, the method may include receiving a set of bits from a memory array. The operations of 505 may be performed in accordance with examples as disclosed herein. In some examples, aspects of the operations of 505 may be performed by a reception component 410 as described with reference to FIG. 4.

At 510, the method may include identifying, based at least in part on a first type of error detection procedure that is operable to detect at least two bit errors associated with the set of bits, that at least two bits of the set of bits are incorrect. The operations of 510 may be performed in accordance with examples as disclosed herein. In some examples, aspects of the operations of 510 may be performed by an error detection component 415 as described with reference to FIG. 4.

At 515, the method may include updating the at least two bits of the set of bits based at least in part on a second type of error detection procedure. The operations of 515 may be performed in accordance with examples as disclosed herein. In some examples, aspects of the operations of 515 may be performed by a bit updating component 420 as described with reference to FIG. 4.

At 520, the method may include transmitting the updated set of bits to a host device. The operations of 520 may be performed in accordance with examples as disclosed herein. In some examples, aspects of the operations of 520 may be performed by a transmission component 425 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor) for receiving a set of bits from a memory array, identifying, based at least in part on a first type of error detection procedure that is operable to detect at least two bit errors associated with the set of bits, that at least two bits of the set of bits are incorrect, updating the at least two bits of the set of bits based at least in part on a second type of error detection procedure, and transmitting the updated set of bits to a host device.

In some examples of the method 500 and the apparatus described herein, the first type of error detection procedure may be based at least in part on a first type of error detection code, the second type of error detection procedure may be based at least in part on a second type of error detection code different than the first type, and the apparatus may include features, circuitry, logic, means, or instructions (e.g., a non-transitory computer-readable medium storing instructions executable by a processor) for receiving a second set of bits, where the set of bits may be associated with a first error detection code of the first type, the second set of bits may be associated with a second error detection code of the first type, and the set of bits and the second set of bits may be each associated with a same error detection code of the second type.

In some examples of the method 500 and the apparatus described herein, operations, features, circuitry, logic, means, or instructions for updating the at least two bits of the set of bits may include operations, features, circuitry, logic, means, or instructions for generating one or more candidate sets of bits, each of the one or more candidate sets of bits based at least in part on altering a respective two bits within the set of bits, and evaluating each of the one or more candidate sets of bits using the second type of error detection procedure until a candidate set of bits is identified as error-free, where the updated set of bits includes the candidate set of bits that is identified as error-free.

Some examples of the method 500 and the apparatus described herein may further include operations, features, circuitry, logic, means, or instructions for verifying, after updating the at least two bits and based at least in part on the first type of error detection procedure, that each bit of the updated set of bits is correct, where transmitting the updated set of bits to the host device may be based at least in part on verifying that each bit of the updated set of bits is correct.

Some examples of the method 500 and the apparatus described herein may further include operations, features, circuitry, logic, means, or instructions for receiving one or more parity bits associated with the second type of error detection procedure from the memory array, where updating the at least two bits may be based at least in part on the one or more parity bits.

In some examples of the method 500 and the apparatus described herein, the first type of error detection procedure may be based at least in part on a SECDED code, and the second type of error detection procedure may be based at least in part on an CRC code.

In some examples of the method 500 and the apparatus described herein, the memory array may be a NAND memory array configured to store the set of bits.

In some examples of the method 500 and the apparatus described herein, the set of bits may be received at SRAM memory cells, where identifying that the at least two bits of the set of bits are incorrect and updating the at least two bits of the set of bits occurs after the set of bits are received at the SRAM memory cells.

Figure 6:
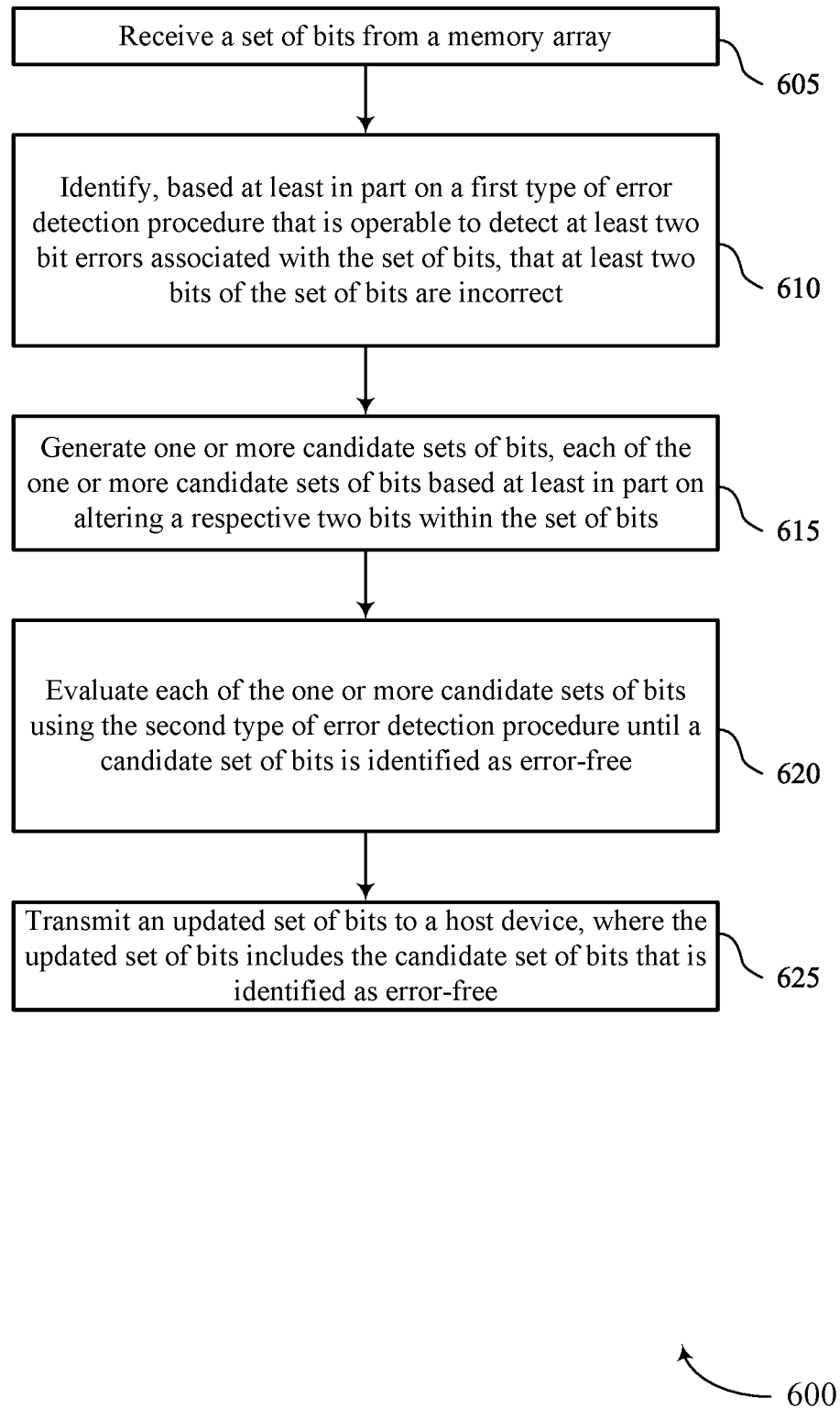

FIG. 6 shows a flowchart illustrating a method 600 that supports memory error correction based on layered error detection in accordance with examples as disclosed herein. The operations of method 600 may be implemented by a memory system or its components as described herein. For example, the operations of method 600 may be performed by a memory system as described with reference to FIGS. 1 through 4. In some examples, a memory system may execute a set of instructions to control the functional elements of the device to perform the described functions. Additionally or alternatively, the memory system may perform aspects of the described functions using special-purpose hardware.

At 605, the method may include receiving a set of bits from a memory array. The operations of 605 may be performed in accordance with examples as disclosed herein.

In some examples, aspects of the operations of 605 may be performed by a reception component 410 as described with reference to FIG. 4.

At 610, the method may include identifying, based at least in part on a first type of error detection procedure that is operable to detect at least two bit errors associated with the set of bits, that at least two bits of the set of bits are incorrect. The operations of 610 may be performed in accordance with examples as disclosed herein. In some examples, aspects of the operations of 610 may be performed by an error detection component 415 as described with reference to FIG. 4.

At 615, the method may include generating one or more candidate sets of bits, each of the one or more candidate sets of bits based at least in part on altering a respective two bits within the set of bits. The operations of 615 may be performed in accordance with examples as disclosed herein. In some examples, aspects of the operations of 615 may be performed by a bit updating component 420 as described with reference to FIG. 4.

At 620, the method may include evaluating each of the one or more candidate sets of bits using the second type of error detection procedure until a candidate set of bits is identified as error-free. The operations of 620 may be performed in accordance with examples as disclosed herein. In some examples, aspects of the operations of 620 may be performed by a bit updating component 420 as described with reference to FIG. 4.

At 625, the method may include transmitting an updated set of bits to a host device, where the updated set of bits includes the candidate set of bits that is identified as error-free. The operations of 625 may be performed in accordance with examples as disclosed herein. In some examples, aspects of the operations of 625 may be performed by a transmission component 425 as described with reference to FIG. 4.

It should be noted that the methods described above describe possible implementations, and that the operations and the steps may be rearranged or otherwise modified and that other implementations are possible. Further, portions from two or more of the methods may be combined.

An apparatus is described. The apparatus may include a memory array and a controller coupled with the memory array. The controller may be configured to cause the apparatus to receive a set of bits from the memory array, identify, based at least in part on a first type of error detection procedure that is operable to detect at least two bit errors associated with the set of bits, that at least two bits of the set of bits are incorrect, update the at least two bits of the set of bits based at least in part on a second type of error detection procedure, and transmit the updated set of bits to a host device In some examples of the apparatus, the first type of error detection procedure may be based at least in part on a first type of error detection code, the second type of error detection procedure may be based at least in part on a second type of error detection code different than the first type of error detection code, and the controller may be further configured to cause the apparatus to receive a second set of bits, where the set of bits may be associated with a first error detection code of the first type, the second set of bits may be associated with a second error detection code of the first type, and the set of bits and the second set of bits may be each associated with a same error detection code of the second type.

In some examples of the apparatus, to update the at least two bits of the set of bits, the controller may be configured to cause the apparatus to generate one or more candidate sets of bits, each of the one or more candidate sets of bits based at least in part on altering a respective two bits within the set of bits, and evaluate each of the one or more candidate sets of bits using the second type of error detection procedure until a candidate set of bits is identified as error-free, where the updated set of bits includes the candidate set of bits that is identified as error-free.

In some examples of the apparatus, the controller may be further configured to verify, after updating the at least two bits and based at least in part on the first type of error detection procedure, that each bit of the updated set of bits is correct, where transmitting the updated set of bits to the host device may be based at least in part on verifying that each bit of the updated set of bits is correct.

In some examples of the apparatus, the controller may be further configured to receive one or more parity bits associated with the second type of error detection procedure from the memory array, where updating the at least two bits may be based at least in part on the one or more parity bits.

In some examples of the apparatus, the first type of error detection procedure may be based at least in part on a SECDED code, and the second type of error detection procedure may be based at least in part on an CRC code.

In some examples of the apparatus, the memory array includes a NAND memory array configured to store the set of bits.

In some examples of the apparatus, the apparatus further includes static random-SRAM memory cells configured to receive the set of bits, where the controller may be configured to cause the apparatus to identify that the at least two bits of the set of bits are incorrect and update the at least two bits of the set of bits after the set of bits are received at the SRAM memory cells.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

If used to describe a conditional action or process, the terms "if," "when," "based on," "based at least in part on," and "in response to" may be interchangeable.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
 a memory array; and
 a controller coupled with the memory array and configured to cause the apparatus to:
 receive a set of bits from the memory array;
 update at least two bits of the set of bits from the memory array based at least in part on an indication from a first type of error detection procedure that is operable to detect at least two bit errors associated with the set of bits from the memory array, wherein the at least two bits are selected based at least in part on a second type of error detection procedure; and
 verify the set of bits from the memory array comprising the updated at least two bits of the set of bits based at least in part on the first type of error detection procedure.

2. The apparatus of claim 1, wherein:
 the first type of error detection procedure is based at least in part on a first type of error detection code; and
 the second type of error detection procedure is based at least in part on a second type of error detection code different than the first type of error detection code.

3. The apparatus of claim 1, wherein, to update the at least two bits of the set of bits, the controller is further configured to cause the apparatus to:
 evaluate each of one or more candidate sets of bits using the second type of error detection procedure to determine a candidate set of bits that is error-free, wherein the updated set of bits comprises the candidate set of bits that is error-free.

4. The apparatus of claim 1, wherein the controller is further configured to:
 receive one or more parity bits from the memory array, wherein updating the at least two bits of the set of bits is based at least in part on the one or more parity bits.

5. The apparatus of claim 1, wherein the at least two bits are associated with the at least two bit errors.

6. The apparatus of claim 1, wherein the memory array comprises a NOT-AND (NAND) memory array.

7. A non-transitory computer-readable medium storing code comprising instructions which, when executed by a processor of an electronic device, cause the electronic device to:
- receive a set of bits from a memory array;
- update at least two bits of the set of bits from the memory array based at least in part on an indication from a first type of error detection procedure that is operable to detect at least two bit errors associated with the set of bits from the memory array, wherein the at least two bits are selected based at least in part on a second type of error detection procedure; and
- verify the set of bits from the memory array comprising the updated at least two bits of the set of bits based at least in part on the first type of error detection procedure.

8. The non-transitory computer-readable medium of claim 7, wherein:
- the first type of error detection procedure is based at least in part on a first type of error detection code; and
- the second type of error detection procedure is based at least in part on a second type of error detection code different than the first type of error detection code.

9. The non-transitory computer-readable medium of claim 7, wherein, to update the at least two bits of the set of bits, the instructions, when executed by the processor of the electronic device, further cause the electronic device to:
- evaluate each of one or more candidate sets of bits using the second type of error detection procedure to determine a candidate set of bits that is error-free, wherein the updated set of bits comprises the candidate set of bits that is error-free.

10. The non-transitory computer-readable medium of claim 7, wherein the instructions, when executed by the processor, further cause the electronic device to:
- receive one or more parity bits from the memory array, wherein updating the at least two bits of the set of bits is based at least in part on the one or more parity bits.

11. The non-transitory computer-readable medium of claim 7, wherein the at least two bits are associated with the at least two bits errors.

12. The non-transitory computer-readable medium of claim 7, wherein the memory array comprises a NOT-AND (NAND) memory array.

13. A method, comprising:
- receiving a set of bits from a memory array;
- at least two bits of the set of bits from the memory array based at least in part on an indication from a first type of error detection procedure that is operable to detect at least two bit errors associated with the set of bits from the memory array, wherein the at least two bits are selected based at least in part on a second type of error detection procedure; and
- verifying the set of bits from the memory array comprising the updated at least two bits of the set of bits based at least in part on the first type of error detection procedure.

14. The method of claim 13, wherein:
- the first type of error detection procedure is based at least in part on a first type of error detection code; and
- the second type of error detection procedure is based at least in part on a second type of error detection code different than the first type of error detection code.

15. The method of claim 13, wherein updating the at least two bits of the set of bits comprises:
- evaluating each of one or more candidate sets of bits using the second type of error detection procedure to determine a candidate set of bits that is error-free, wherein the updated set of bits comprises the candidate set of bits that is error-free.

16. The method of claim 13, further comprising:
- receiving one or more parity bits from the memory array, wherein updating the at least two bits of the set of bits is based at least in part on the one or more parity bits.

17. The method of claim 13, wherein the at least two bits are associated with the at least two bit errors.

18. The apparatus of claim 1, wherein the second type of error detection procedure is applied across a plurality of sets of bits comprising the set of bits.

19. The non-transitory computer-readable medium of claim 7, wherein the second type of error detection procedure is applied across a plurality of sets of bits comprising the set of bits.

20. The method of claim 13, wherein the second type of error detection procedure is applied across a plurality of sets of bits comprising the set of bits.

* * * * *